US006988046B2

United States Patent
Endo et al.

(10) Patent No.: US 6,988,046 B2
(45) Date of Patent: Jan. 17, 2006

(54) TEST METHOD OF MEMORY IC FUNCTION ON DEVICE BOARD WITH DYNAMIC COMPETING CYCLE

(75) Inventors: Hitoshi Endo, Tokyo (JP); Tomohiro Kamiyama, Gunma (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 62 days.

(21) Appl. No.: 10/668,252

(22) Filed: Sep. 24, 2003

(65) Prior Publication Data

US 2004/0064284 A1 Apr. 1, 2004

Related U.S. Application Data

(60) Provisional application No. 60/413,756, filed on Sep. 27, 2002.

(51) Int. Cl.
*G06F 19/00* (2006.01)

(52) U.S. Cl. .................................................... 702/117
(58) Field of Classification Search ................. 702/117, 702/119; 714/739, 738, 25, 720; 705/54, 705/64, 53; 380/277; 713/200, 193, 189, 713/201; 365/201; 438/17, 54; 280/222
See application file for complete search history.

(56) References Cited

U.S. PATENT DOCUMENTS

| 4,730,319 A | * | 3/1988 | David et al. ................. 714/739 |
| 5,946,247 A | * | 8/1999 | Osawa et al. ............... 365/201 |
| 2004/0053429 A1 | * | 3/2004 | Muranaka .................... 438/17 |

OTHER PUBLICATIONS

Eric Knorr, The PC Bible, 1995, Peachpit Press, $2^{nd}$ edition, p. 166–167.*

* cited by examiner

*Primary Examiner*—John Barlow
*Assistant Examiner*—Tung S. Lau
(74) *Attorney, Agent, or Firm*—Volentine Francos & Whitt, PLLC

(57) ABSTRACT

In a test method of a memory IC function, memory ICs of different types are prepared after a memory tester is prepared. The data related to each test method of these memory ICs is transmitted to the memory tester. Further, after a random number is generated, a test of a predetermined memory IC is executed in reply to the generated random number. It is checked whether the tests of all the memory ICs are finished or not: and the generation of the random number and the execution of the test are repeated when they are not finished, while the processing is finished when they are finished.

18 Claims, 12 Drawing Sheets

>sram, t1, paXXXXXXXX, pbXXXXXXXX, pc4, pe1, pg1, ph1, pi1 →  →
SRAM test start

>sdram, t1, paXXXXXXXX, pbXXXXXXXX, pc4, pe1, pg1, ph1, pi1 →  →
SDRAM test start

EXECUTE THE SRAM TEST 1 (W/R/C TEST) UNDER THE FOLLOWING CONDITIONS.

pa: ACCESS START ADDRESS
    pb: ACCESS END ADDRESS
    pc: ACCESS TYPE (1: 8 BITS/2: 16 BITS/3: 32 BITS/4: ALL)
    pe: TEST DATA (1: INCREMENT DATA/2: FIXED DATA)
    pg: EXECUTION TIME, ONCE
    ph: THERE IS/ISN'T DISPLAY DURING EXECUTION (1: NO DIAPLAY/2: DISPLAY)
    pi: OPERATION IN THE EVENT OF ERROR GENERATION (1: STOP/2: CONTINUE)

EXECUTE THE SDRAM TEST 1 (W/R/C TEST) UNDER THE FOLLOWING CONDITIONS.

pa: ACCESS START ADDRESS
    pb: ACCESS END ADDRESS
    pc: ACCESS TYPE (1: 8 BITS/2: 16 BITS/3: 32 BITS/4: ALL)
    pe: TEST DATA (1: INCREMENT DATA/2: FIXED DATA)
    pg: EXECUTION TIME, ONCE
    ph: THERE IS/ISN'T DISPLAY DURING EXECUTION (1: NO DIAPLAY/2: DISPLAY)
    pi: OPERATION IN THE EVENT OF ERROR GENERATION (1: STOP/2: CONTINUE)

UPON RECEIPT OF THE "END" COMMAND DURING THE EXECUTION OF THE TEST, THE CURRENT EXECUTING TEST IS CANCELLED AND FINISHED.

FIG. 9

TEST METHOD OF MEMORY IC FUNCTION ON DEVICE BOARD WITH DYNAMIC COMPETING CYCLE

CROSS-REFERENCE TO RELATED APPLICATIONS

The present application claims the benefit of U.S. provisional patent application Ser. No. 60/413,756, filed on Sep. 27, 2002.

BACKGROUND OF THE INVENTION

The present invention relates to a method of estimating a function of a memory IC on a board of a device (hereinafter, referred to as a lower device), connected to a controller by a communication interface not especially specified, capable of receiving a control therefrom.

Hitherto, in order to estimate the IC function on a board of a lower device, a controller is connected to a communication interface of the lower device, simulated control software is activated on the controller, built-in software for the estimation of the memory IC function is downloaded from the controller to the lower device, and the controller gives an instruction to the built-in software for the estimation of the memory IC function on the lower device, thereby performing a separate function test and a competing function test combined with a plurality memory ICs on a plurality of memory ICs (Flash ROM, SRAM, SDRAM) installed on the board of the lower device.

In the competing function test of the memory ICs (Flash ROM, SRAM, SDRAM) installed on the board of the lower device, according to the built-in software for the estimation of the memory IC function on the lower device, however, the competing timing is fixed, namely, when a test of a memory IC of a predetermined size is finished, it is switched to a test of another memory IC, and accordingly, there is such a problem that a test of the actual competing timing occurring in real circumstances can not be realized. Therefore, there have been cases that failures after the shipment of the boards built in products.

SUMMARY OF THE INVENTION

The invention is to solve the above problem by dynamically varying the competing timing to any cycle in the competition test of a plurality of memory ICs (Flash ROM, SRAM, SDRAM) installed on a board of the lower device by the built-in software for the estimation of the memory IC function on the lower device.

In a test method of a memory IC function according to this invention, memory ICs of different types are prepared after a memory tester is prepared. The data related to each test method of these memory ICs is transmitted to the memory tester. Further, after a random number is generated, a test of a predetermined memory IC is executed in reply to the generated random number. When it is checked whether the tests of all the memory ICs are finished or not, the generation of the random number and the execution of the test are repeated, when they are not finished, while when they are finished, the processing is finished.

BRIEF DESCRIPTION OF THE DRAWINGS

FIG. 9 is a view showing an input screen of command transmission data.

DETAILED DESCRIPTION OF THE PREFERRED EMBODIMENTS

Hereinafter, the form of an embodiment in a test method of the invention will be described according to the drawings.

Figure 1:
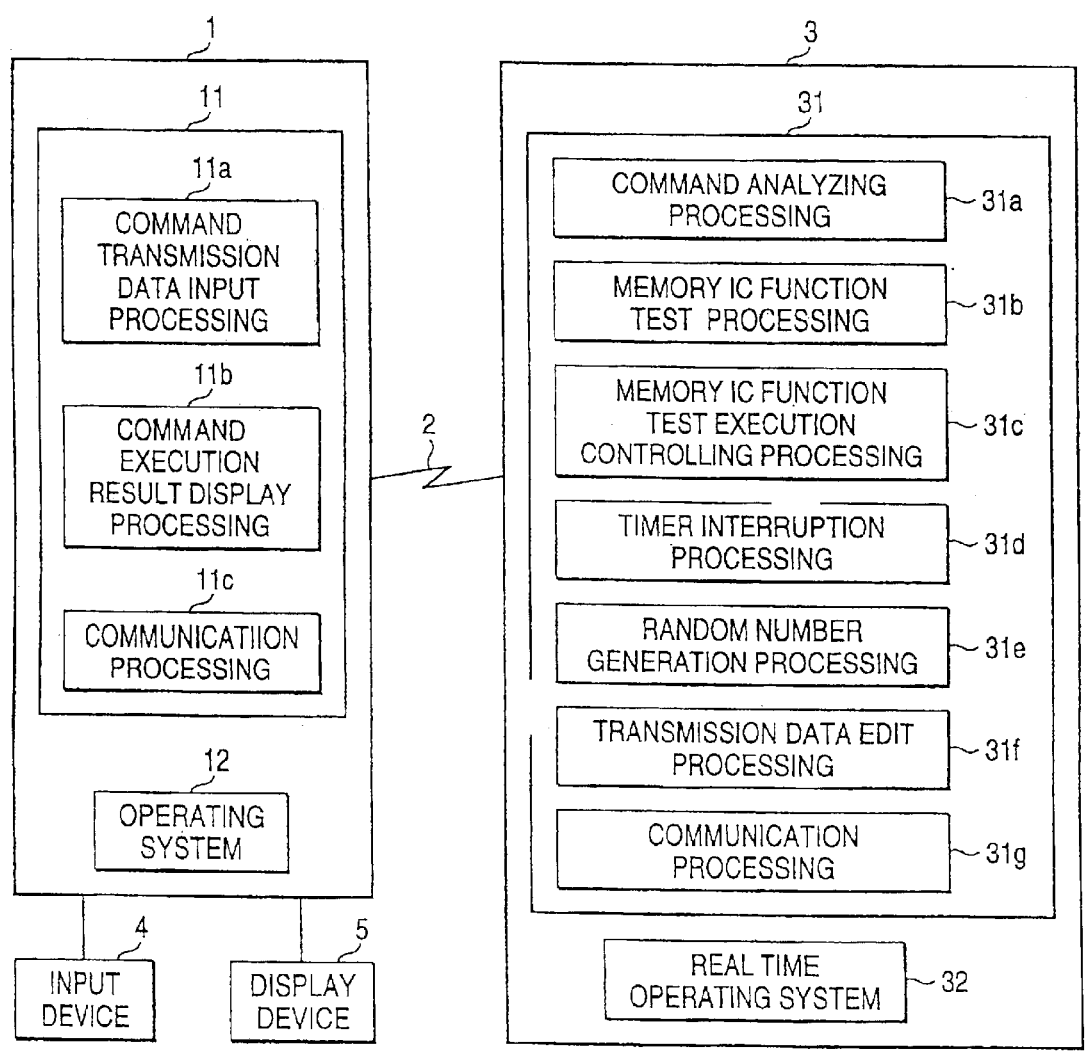
FIG. 1 is a block diagram for describing the structure of a test method of this invention.

FIG. 1 is a block diagram for describing the structure of a test method in this embodiment. A controller 1 is connected to a lower device 3 by a communication interface 2 not especially specified. An input device 4, for example, a keyboard and a mouse, not especially specified, and a display 5, for example, a CRT, not specified, are connected to the controller 1, thereby enabling the input/output operation to/from the controller 1.

The controller 1 includes an operating system 12 not especially specified and a lower device controlling system 11 that is the software running on this operating system. The lower device controlling system 11 comprises command transmission data input processing 11a for inputting the command transmission data for controlling the lower device 3 from the communication interface 2, command execution result display processing 11b for displaying the execution result in the lower device 3 toward the command transmission data, to a user, and communication processing 11c for realizing a communication protocol not especially specified.

The lower device 3 includes a real time operating system 32 for a built-in system not especially specified and a memory IC function estimation system 31 that is the built-in software running on this real time operating system. The memory IC function estimation system 31 comprises command analyzing processing 31a for analyzing the command transmission data from the controller 1 and activating the function test processing of a memory IC, memory IC function test processing 31b for executing the function test of a memory IC, memory IC function test execution controlling processing 31c for controlling the execution order of the memory IC function tests, timer interruption processing 31d periodically activated at arbitrary time, random number generation processing 31e for generating any random number, not especially described, transmission data edit processing 31f for editing the execution result of the memory IC function test in a format displayable in the controller 1, and communication processing 31g for realizing a communication protocol not especially specified.

Figure 2:
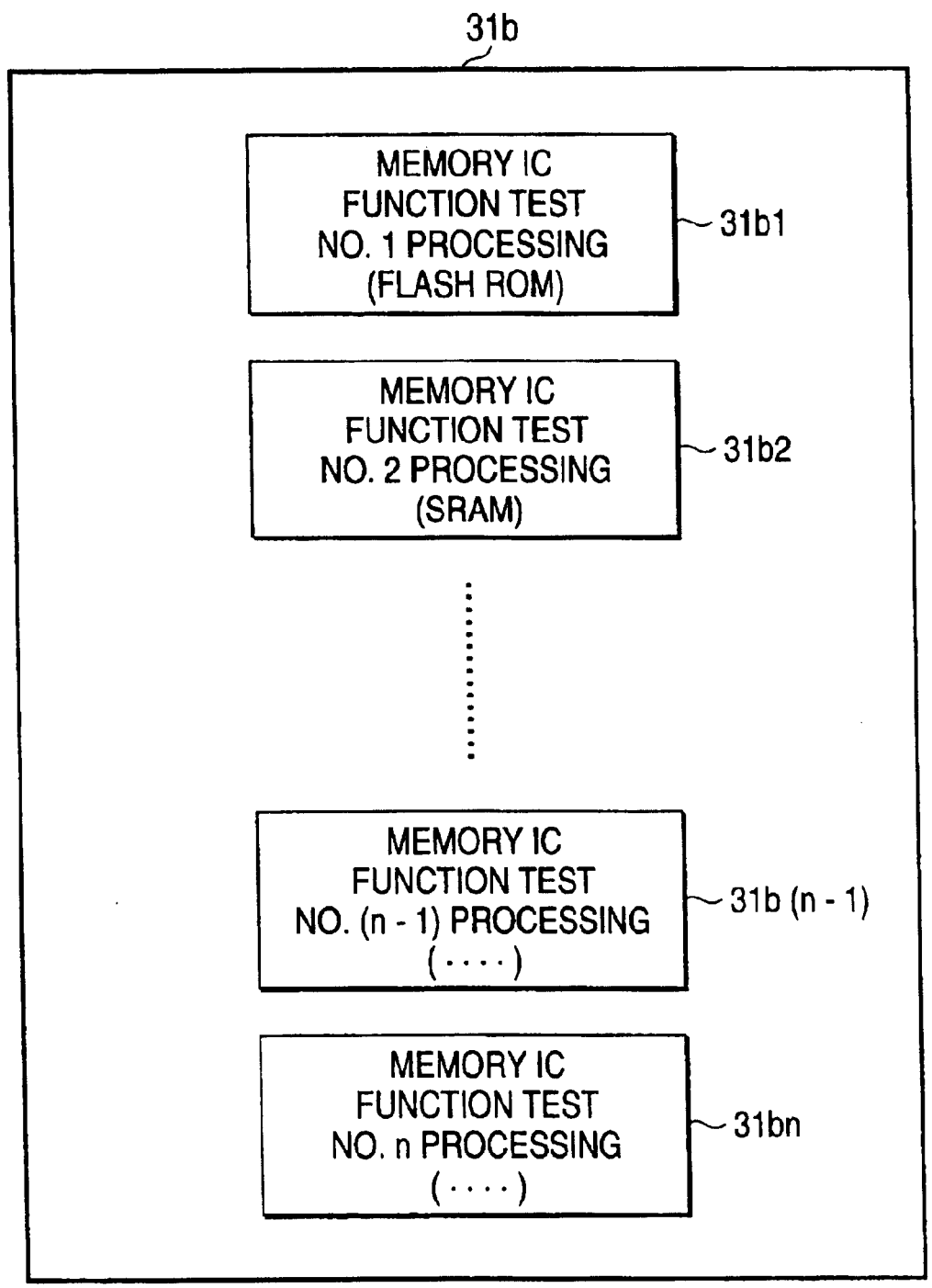
FIG. 2 is a block diagram showing the structure of a function test of a memory IC.
Figure 3:
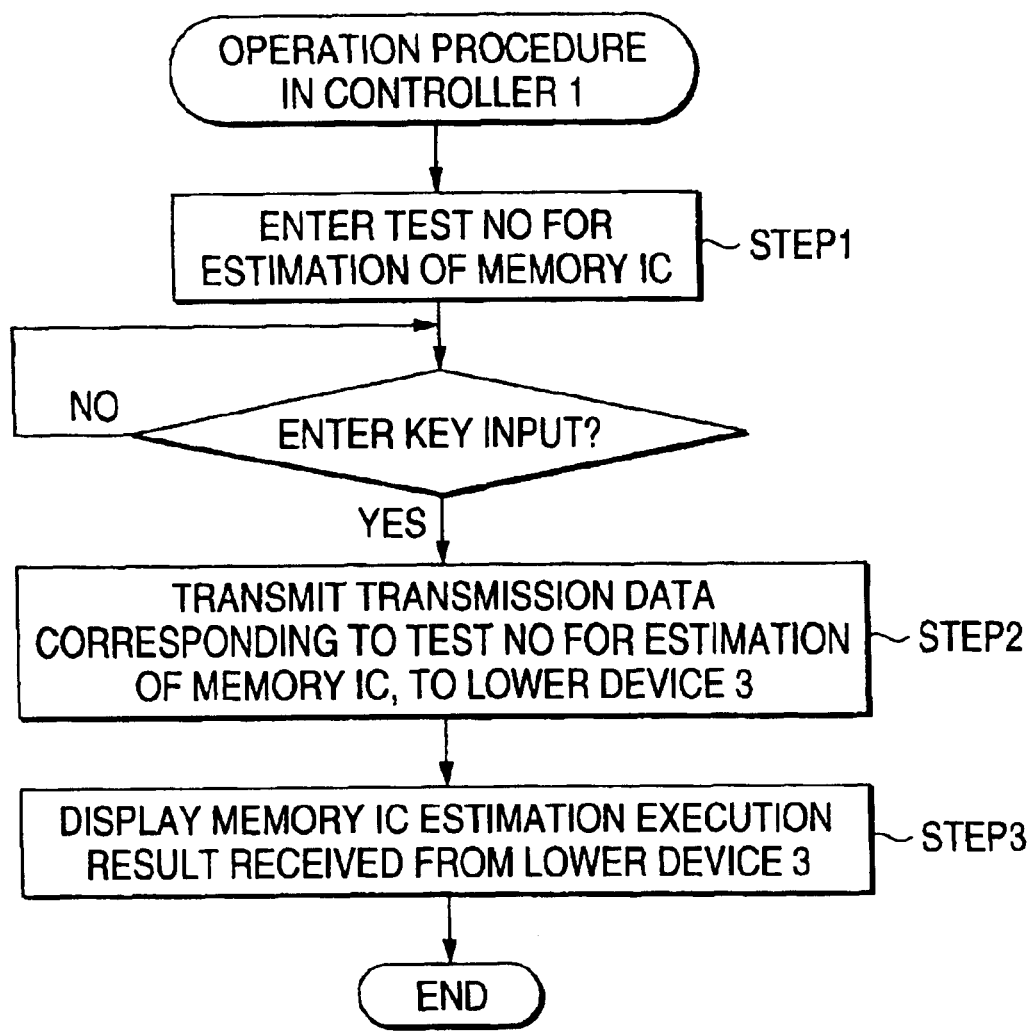
FIG. 3 is a first flow chart for describing the operation procedure of the test method of this invention.
Figure 4:
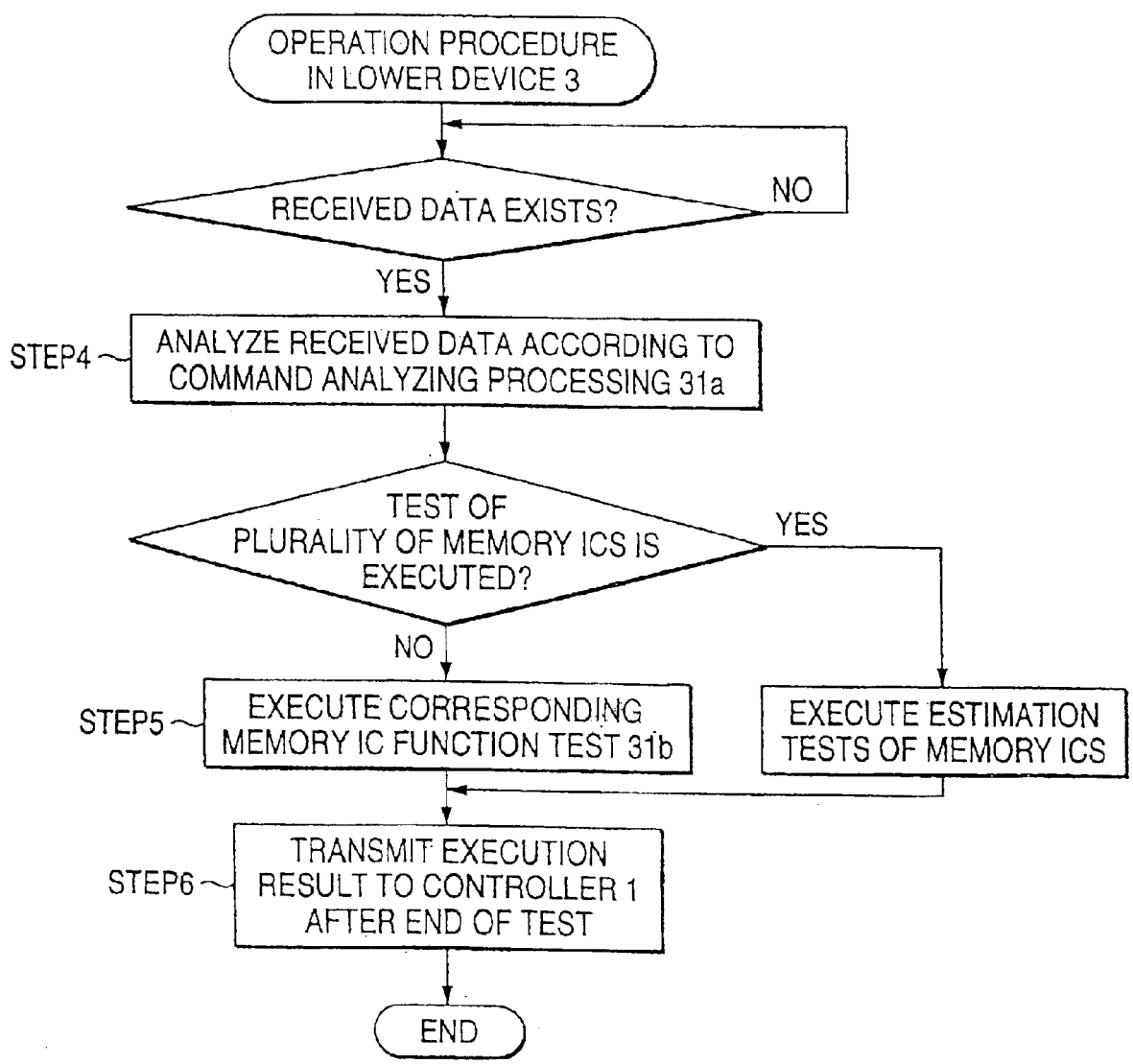
FIG. 4 is a second flow chart for describing the operation procedure of the test method of this invention.
Figure 5:
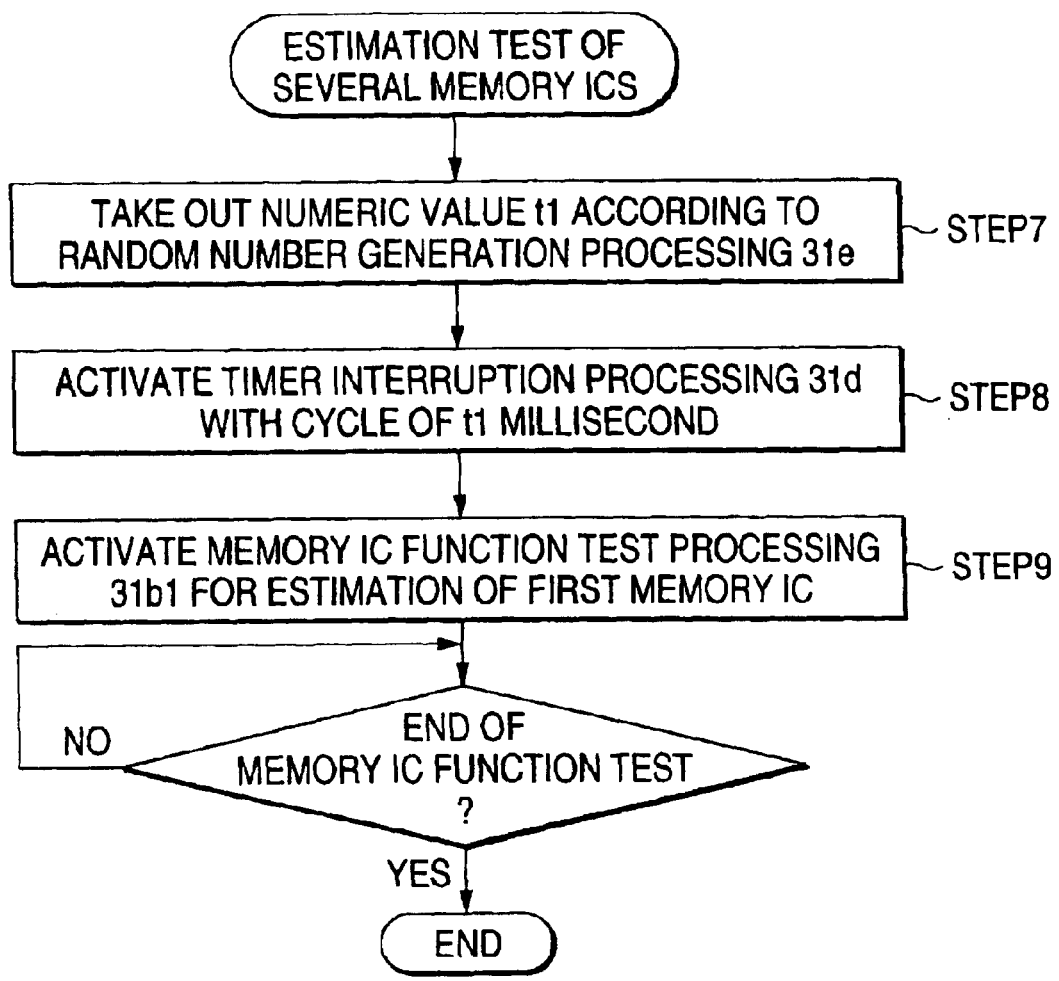
FIG. 5 is a third flow chart for describing the operation procedure of the test method of this invention.
Figure 6:
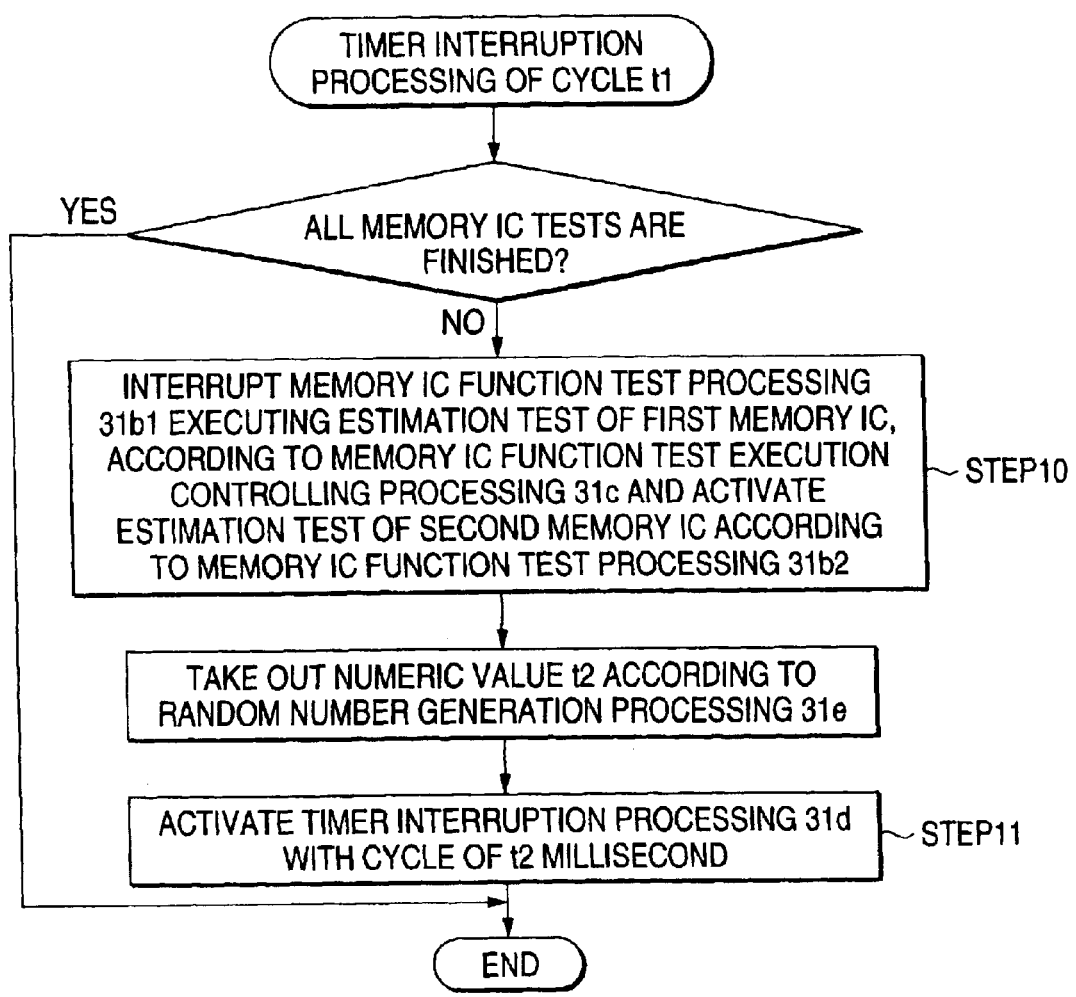
FIG. 6 is a fourth flow chart for describing the operation procedure of the test method of this invention.
Figure 7:
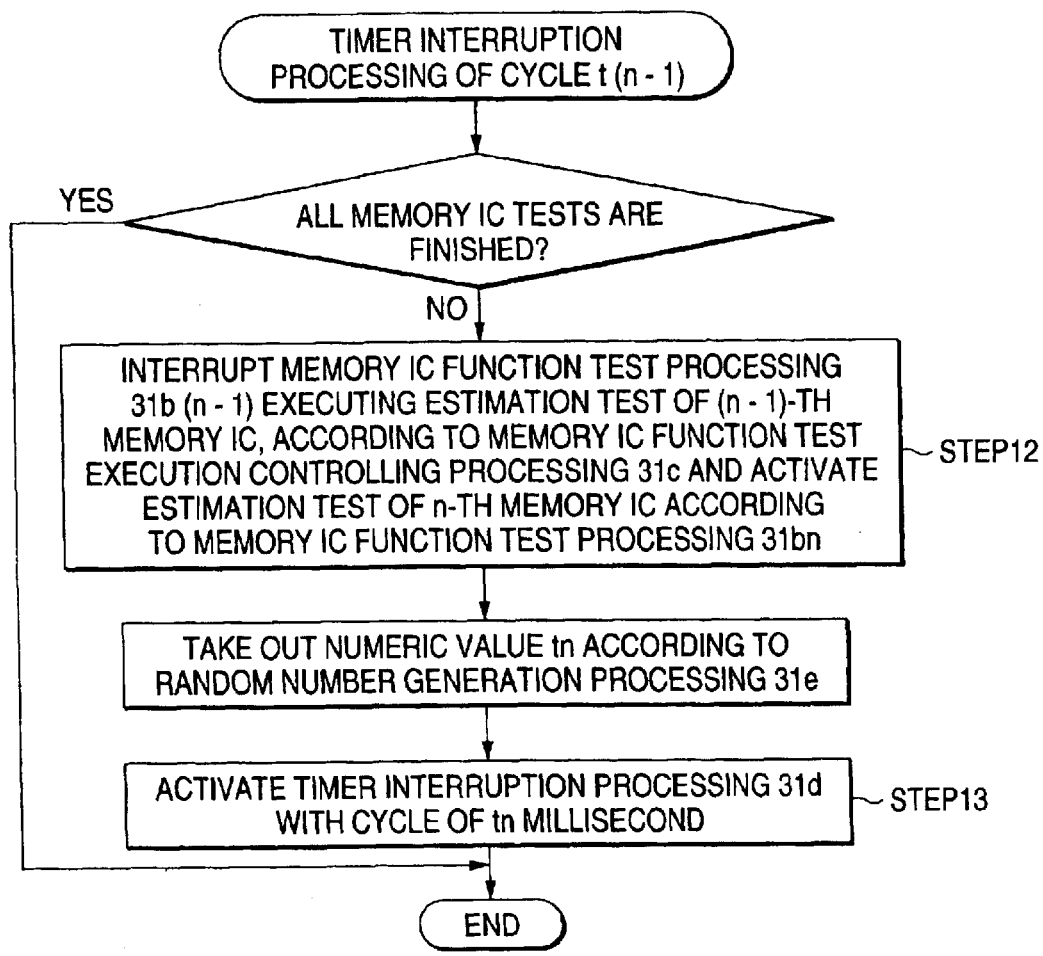
FIG. 7 is a fifth flow chart for describing the operation procedure of the test method of this invention.
Figure 8:
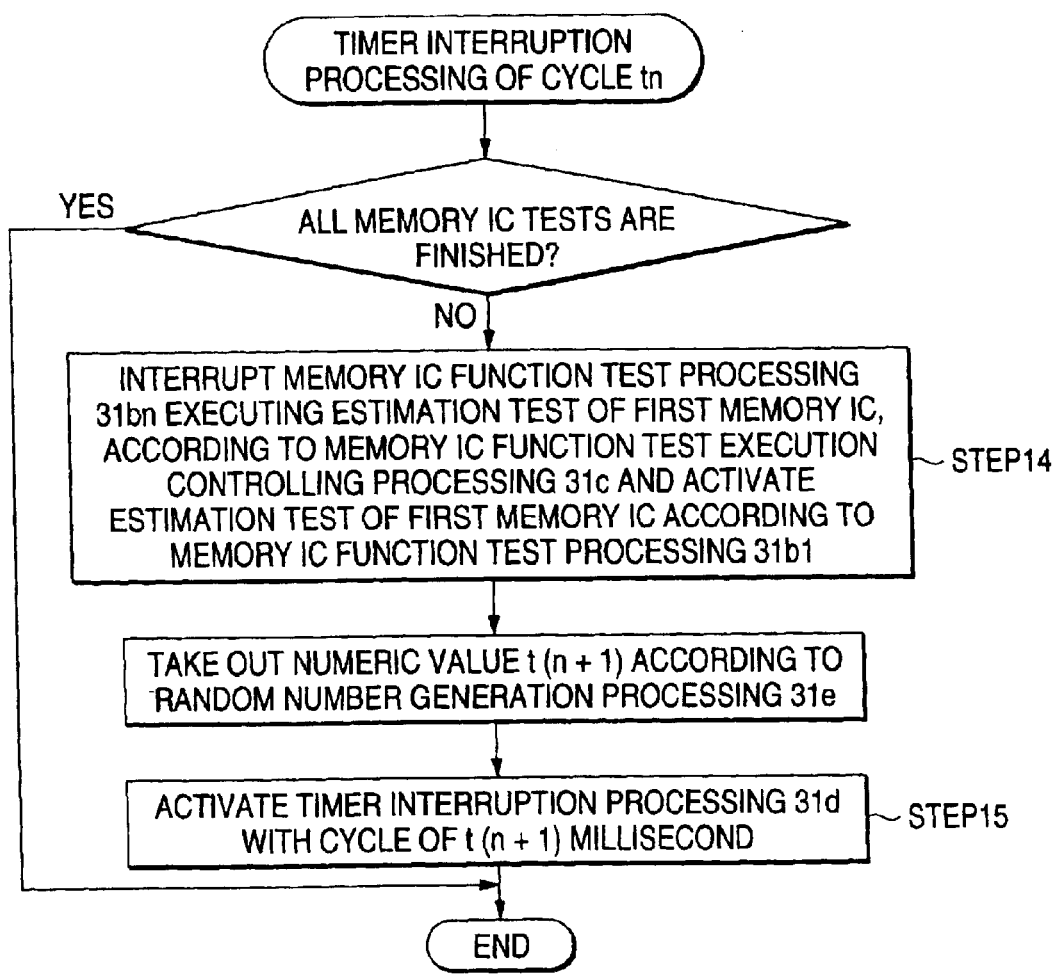
FIG. 8 is a sixth flow chart for describing the operation procedure of the test method of this invention.
Figure 10:
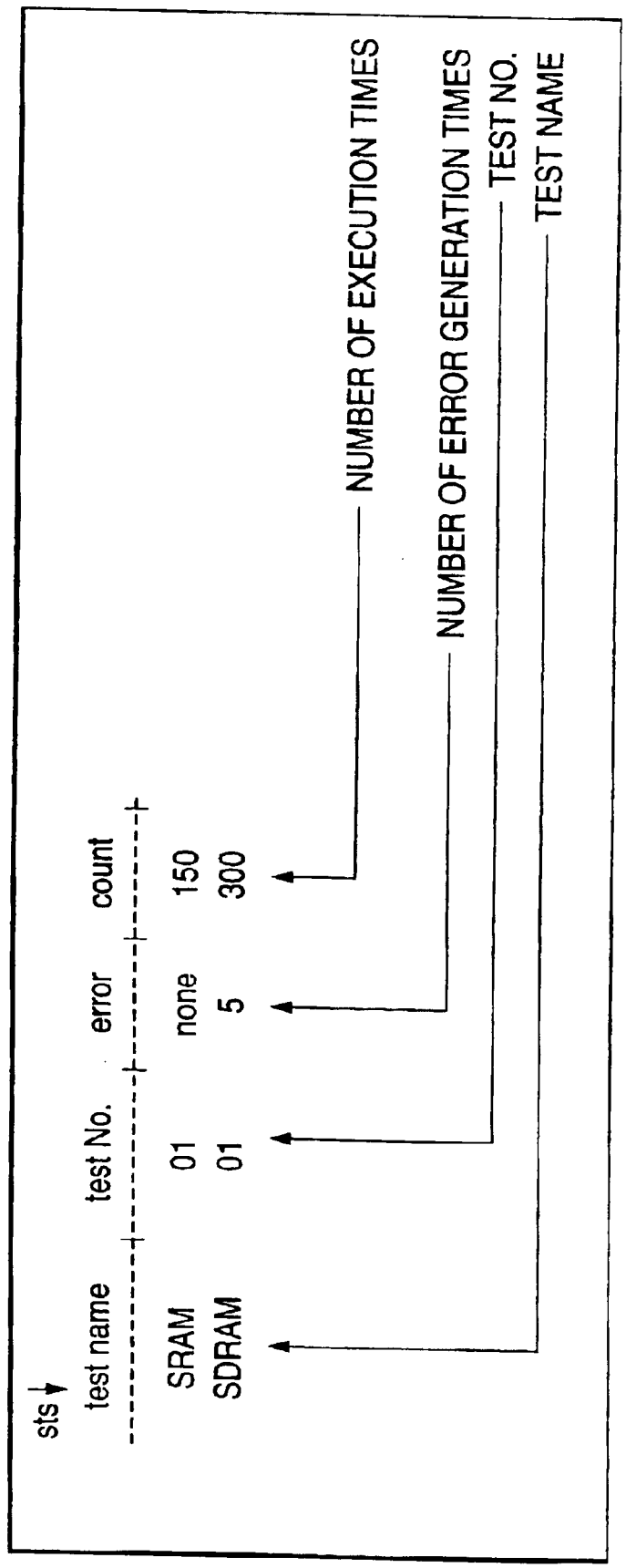
FIG. 10 is a view showing a screen displaying the estimation result of a memory IC.

The operation procedure of the test processing of the memory IC function estimation system, in this embodiment, will be hereinafter described in detail by referring to the drawings. FIG. 2 is a block diagram showing the structure of the memory IC function test processing; FIG. 3 is a schematic flow chart of the operation procedure of the controller 1; FIG. 4 is a schematic flow chart of the operation procedure of the lower device 3; FIG. 5 is a schematic flow chart of the estimation test of a plurality of memory ICs; FIG. 6, FIG. 7, and FIG. 8 are schematic flow charts of the timer interruption processing; FIG. 9 is a command transmission data input screen; and FIG. 10 is a display screen of the memory IC estimation result.

At first, the operation procedure for estimating a memory IC in the controller 1 will be described. FIG. 9 is a view showing a screen of entering a command for controlling the lower device 3 or a test No for the estimation of a memory IC. On this screen, a user enters a command for controlling the lower device 3 or a test No for the estimation of a memory IC by using the input device 4 not specified (STEP 1). Thereafter, the user presses "Enter Key" by using the input device 4, thereby transmitting the transmission data corresponding to a command for controlling the lower device 3 or a test No for the estimation of a memory IC, from the controller 1 to the lower device 3 through the communication interface 2 (STEP 2). Next, the data from the lower device 3 is received through the communication interface 2 and the display screen of the memory IC estimation execution result shown in FIG. 10 is shown on the display 5 as the memory IC estimation execution result (STEP 3).

Now, the operation procedure in executing the estimation operation of a plurality of memory ICs in the lower device 3 will be described. When the lower device 3 receives the transmission data corresponding to the test No for the estimation of the memory IC, from the controller 1 through the communication interface 2, the transmission data from the controller 1 is analyzed in the command analyzing processing 31a (STEP 4).

When the analyzed result is the estimation test No of a single memory IC, the corresponding memory IC function test processing 31b is executed (STEP 5). After completion of the test, the transmission data of the test execution result to the controller 1 is created in the transmission data edit processing 31f and the test execution result is transmitted to the controller 1 through the communication processing 31g and the communication interface 2 (STEP 6). When the analyzed result is the estimation test No of several n (0<n<) memory ICs, at first, the numeric value t1 (0<t1<255) is taken out in the random number generation processing 31e for generating arbitrary random number (STEP 7). Next, the timer interruption processing 31d with the taken out numeric value t1 being defined as a cycle (millisecond) is activated (STEP 8). At the same time, the estimation test of the first memory IC is activated in the memory IC function test processing 31b1 (STEP 9). In the timer interruption processing 31d to be generated after t1 millisecond, the memory IC function test processing 31b1 executing the estimation test of the first memory IC is interrupted by the memory IC function test execution controlling processing 31c for controlling the execution order of the memory IC function tests, and the estimation test of the second memory IC is activated according to the memory IC function test processing 31b2 (STEP 10). Thereafter, the numeric number t2 (0<t2<255) is taken out by the random number generation processing 31e for generating arbitrary random number and the timer interruption processing 31d with t2 being, defined as a cycle (millisecond) is activated (STEP 11).

Similarly, in the timer interruption processing 31d with t(n−1) being defined as a cycle (millisecond), which is taken by the random number generation processing 31e for generating arbitrary random number, the memory IC function test processing 31b (n−1) executing the estimation test of the (n−1)-th memory IC is interrupted by the memory IC function test execution controlling processing 31c for controlling the execution order of the memory IC function tests, and the n-th memory IC estimation test is activated according to the memory IC function test processing 31bn (STEP 12). Thereafter, the numeric value tn (0<tn+1<255) is taken out according to the random number generation processing 31e for generating arbitrary random number and the timer interruption processing 31d with tn being defined as a cycle (millisecond) is activated (STEP 13).

When activating the n-th memory IC estimation test, in the timer interruption processing 31d to be generated after tn millisecond, the memory IC function test processing 31bn executing the estimation test of the n-th memory IC is interrupted according to the memory IC function test execution controlling processing 31c for controlling the execution order of the memory IC function tests, and the estimation test of the first memory IC is resumed after releasing the interrupted state according to the memory IC function test processing 31b1 (STEP 14). Thereafter, the numeric value t (n+1) (0<tn+1<255) is taken out by the random number generation processing 31e for generating arbitrary random number and the timer interruption processing 31d with t(n+1) being defined as a cycle (millisecond) is activated (STEP 15).

Thus, after the estimation tests of the first to the n-th memory ICs have been activated, taking out the random number, activating the timer interruption processing, and interruption of the estimation test of each memory IC during the timer interruption processing and resumption of the estimation test are repeatedly until the estimation tests of all the memory ICs are finished.

After finishing the estimation tests of all the memory ICs, the transmission data of the test execution result to the controller 1 is created in the transmission data edit processing 31f, and the test execution result is transmitted to the controller 1 through the communication processing 31g and the communication interface 2 (STEP 6).

As mentioned above, according to the embodiment, in the competing function test of a plurality of memory ICs (Flash ROM, SRAM, SDRAM) installed on a board of the lower device, the competing timing can be dynamically changed, and the competing function test of the memory ICs (Flash ROM, SRAM, SDRAM) can be achieved under the condition extremely close to the competing timing generated in real circumstances.

Now, a second embodiment will be described. The second embodiment is constituted by adding IC (for example, UART, USB, DMAC) installed on the device board other than the memory IC, as the competing IC in the first embodiment.

Namely, it performs the operation with the other IC (for example, UART, USB, DMAC) installed on the device board added to the subject of IC competing in the memory IC function estimation system of the first embodiment.

Figure 11:
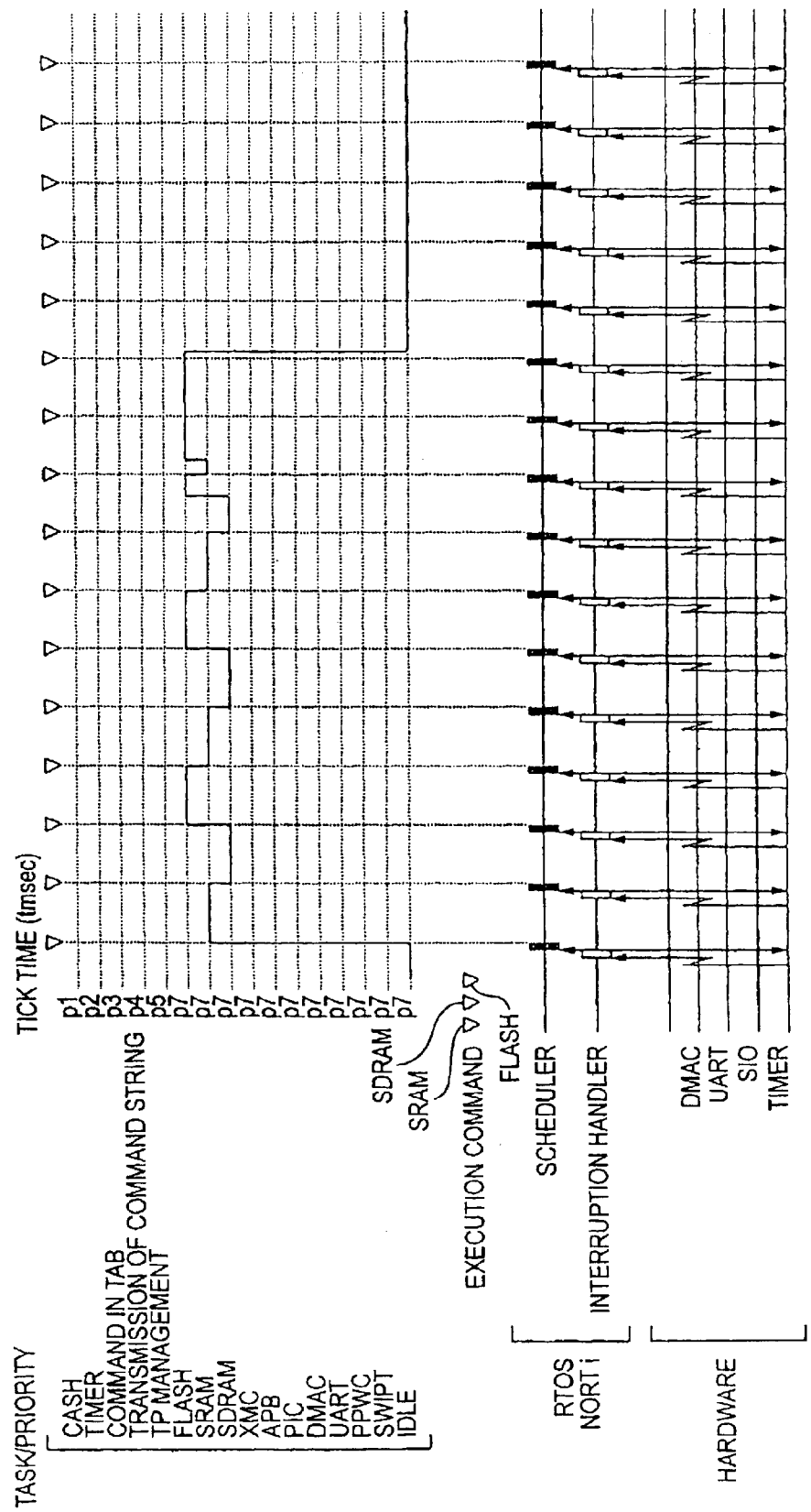
FIG. 11 is a view for describing the operation concept of the test method of this invention.

FIG. 11 is a view for describing the operation concept of a test method according to the second embodiment.

Figure 12:
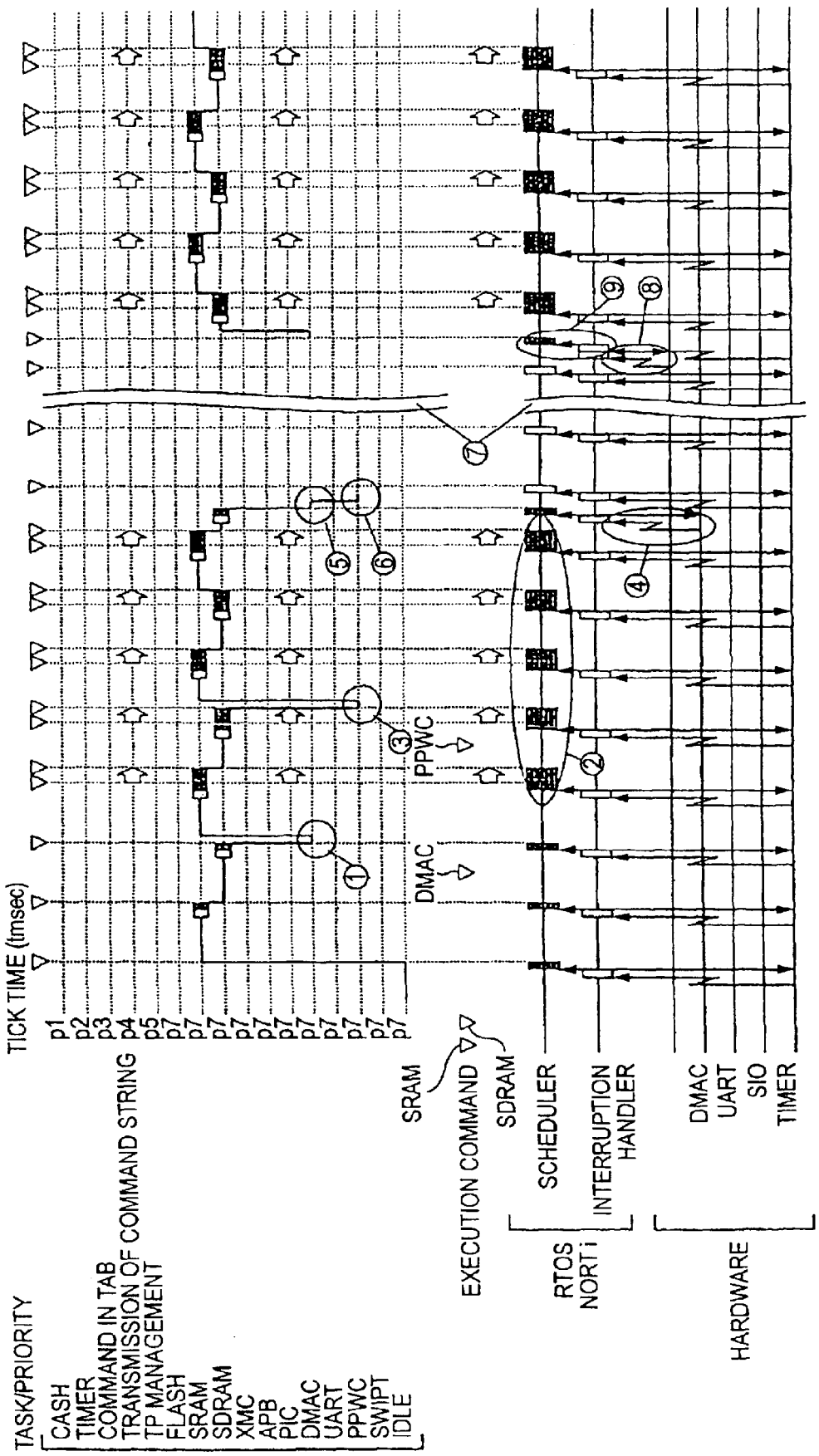
FIG. 12 is a view for describing the operation concept of the test method of this invention in detail.

FIG. 12 is a view for describing the operation concept of the test method in detail according to the second embodiment.

A STOP issuing function of the second embodiment has the following restrictions.

The STOP is not issued during the DMA transfer, SIO transfer, and UART transfer.

After completion of the restriction processing, PPWC task (STOP) is immediately activated.

Accordingly, the following processings are performed in the second embodiment.

The PPWC task (STOP) is activated not according to the management of the scheduler but according to the task to be restricted.

A post call to the PPWC task (STOP) is issued only from the DMAC/SIO/UART task.

The STOP operation will be described referring to FIG. 12 as follows.

① Register setting and mask release of DMAC is performed and the DMA transfer (cycle steal) is executed.

② The processing time of the scheduler is extended during the DMA transfer (cycle steal).

③ The PPWC task is in a waiting state (wait) for post from the DMAC/SIO/UART task.

④ The interruption of the transfer completion is issued from the DMAC.

⑤ The DMAC task issues the post to the PPWC task.

⑥ The PPWC task executes the STOP processing.

⑦ The STOP state. Though the timer is operating, interruption is not supplied because the HCLK is stopped.

⑧ The ** interruption is supplied. The hardware transits from the STOP state into the RUN state.

This interruption is received and abandoned by an interruption handler.

⑨ Since it comes into the RUN state, the HCLK begins to move and an interruption is supplied from the timer.

Upon receipt of the timer interruption, the scheduler processing is performed.

As mentioned above, according to the embodiment, in the competing function test of a plurality of memory ICs (Flash ROM, SRAM, SDRAM), communication interface IC (UART, USB), and CPU peripheral IC (DMAC) installed on a board of the lower device, the competing timing can be dynamically changed, and the competing function test of the memory ICs (Flash ROM, SRAM, SDRAM), communication interface IC (UART, USB), and CPU peripheral IC (DMAC) can be achieved under the condition extremely close to the competing timing generated in real circumstances.

What is claimed is:

1. A test method of a memory IC function, comprising:
preparing a memory tester;
preparing memory ICs of different types;
transmitting data related to each test method of the memory ICs to the memory tester;
generating a random number indicative of a period of time;
executing a test of a predetermined memory IC for the period of time in accordance with the generated random number;
judging whether tests of all the memory ICs are finished or not;
repeating said generating a random number and said executing a test if tests of all the memory ICs are not finished; and
ending processing if tests of all the memory ICs are finished.

2. The test method of a memory IC function, according to claim 1, wherein the random number is an arbitrary integer from 0 to 255.

3. The test method of a memory IC function, according to claim 1, wherein the memory ICs include Flash ROM, SRAM, and SDRAM.

4. The test method of a memory IC function, according to claim 1, further comprising performing timer interruption processing after said executing a test.

5. The test method of a memory IC function, according to claim 4, wherein the timer interruption processing is performed with a predetermined cycle.

6. The test method of a memory IC function, according to claim 5, wherein the predetermined cycle is in a range of milliseconds.

7. A test method of a memory IC function, comprising:
preparing a memory tester;
preparing ICs of different types;
transmitting data related to each test method of the ICs to the memory tester;
generating a random number;
executing a test of a predetermined IC based on the generated random number;
judging whether tests of all the ICs are finished or not;
repeating said generating a random number and said executing a test if tests of all the ICs are not finished; and
ending processing if tests of all the ICs are finished,
wherein the ICs include a memory IC, a communication interface IC, and a CPU peripheral IC, and wherein the memory IC includes Flash ROM, SRAM, and SDRAM.

8. The test method of a memory IC function, according to claim 7, wherein the random number is an arbitrary integer from 0 to 255.

9. The test method of a memory IC function, according to claim 7, wherein the communication interface IC is an IC including a UART interface and a universal serial bus interface.

10. The test method of a memory IC function, according to claim 7, further comprising performing timer interruption processing after said executing a test.

11. The test method of a memory IC function, according to claim 10, wherein the timer interruption processing is performed with a predetermined cycle.

12. The test method of a memory IC function, according to claim 11, wherein the predetermined cycle is in a range of milliseconds.

13. A test method of a memory IC function, comprising:
preparing a memory tester;
preparing ICs of different types;
transmitting data related to each test method of the ICs to the memory tester;
generating a random number;
executing a test of a predetermined IC based on the generated random number;
judging whether tests of all the ICs are finished or not;
repeating said generating a random number and said executing a test if tests of all the ICs are not finished; and
ending processing if tests of all the ICs are finished,
wherein the ICs include a memory IC, a communication interface IC, and a CPU peripheral IC, and wherein the CPU peripheral IC is an IC including DMAC.

14. The test method of a memory IC function according to claim 13, wherein the random number is an arbitrary integer from 0 to 255.

15. The test method of a memory IC function, according to claim 13, wherein the communication interface IC is an IC including a UART interface and a universal serial bus interface.

16. The test method of a memory IC function, according to claim 13, further comprising performing timer interruption processing after said executing a test.

17. The test method of a memory IC function, according to claim 16, wherein the timer interruption processing is performed with a predetermined cycle.

18. The test method of a memory IC function, according to claim 17, wherein the predetermined cycle is in a range of milliseconds.

* * * * *